(12) United States Patent
Lee et al.

(10) Patent No.: US 11,765,852 B2
(45) Date of Patent: Sep. 19, 2023

(54) ELECTRONIC APPARATUS AND MOUNTING BASE THEREOF

(71) Applicant: Wistron NeWeb Corp., Hsinchu (TW)

(72) Inventors: Chun-Yu Lee, Hsinchu (TW); Sheng-Yuan Chen, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 17/844,206

(22) Filed: Jun. 20, 2022

(65) Prior Publication Data

US 2023/0118729 A1 Apr. 20, 2023

(51) Int. Cl.
*H05K 7/16* (2006.01)
*H05K 7/14* (2006.01)

(52) U.S. Cl.
CPC ............ *H05K 7/16* (2013.01); *H05K 7/1401* (2013.01)

(58) Field of Classification Search
CPC ...... H05K 7/16; H05K 7/1401; H05K 5/0204; G06F 1/18
See application file for complete search history.

(56) References Cited

U.S. PATENT DOCUMENTS

| | | | |
|---|---|---|---|
| 5,696,746 A * | 12/1997 | Ookawa | G11B 33/121 |
| 7,033,222 B2 * | 4/2006 | Kitamura | H01R 13/2442 |
| | | | 439/862 |
| 10,161,565 B2 * | 12/2018 | Wu | F16F 1/12 |
| 11,013,136 B2 * | 5/2021 | Wang | H05K 1/181 |
| 11,092,282 B2 * | 8/2021 | Weng | F16M 13/027 |
| 11,218,580 B2 * | 1/2022 | Davis | F16M 11/10 |

FOREIGN PATENT DOCUMENTS

CN 112393096 A 2/2021

* cited by examiner

*Primary Examiner* — Anthony Q Edwards
*Assistant Examiner* — Hung Q Dang
(74) *Attorney, Agent, or Firm* — McClure, Qualey & Rodack, LLP

(57) ABSTRACT

A mounting base is provided. The mounting base is adapted to be selectively affixed to different supporting structures. The mounting base includes a mounting base body, a first hook, a second hook and a rotatable member. The first hook is formed on the mounting base body. The second hook is formed on the mounting base body. The rotatable member is pivoted on the mounting base body. The rotatable member is adapted to be rotated between a first orientation and the second orientation relative to the mounting base body. When the rotatable member is in the first orientation, the rotatable member is restricted by the mounting base body. When the rotatable member is in the second orientation, the rotatable member is restricted by the mounting base body.

14 Claims, 9 Drawing Sheets

ELECTRONIC APPARATUS AND MOUNTING BASE THEREOF

CROSS REFERENCE TO RELATED APPLICATIONS

This application claims priority of Taiwan Patent Application No. 110138781, filed on Oct. 20, 2021, the entirety of which is incorporated by reference herein.

BACKGROUND OF THE INVENTION

Field of the Invention

The present invention relates to a mounting base, and in particular to a mounting base utilized to affix an electronic device.

Description of the Related Art

Wireless routers and similar electronic devices are commonly suspended on a ceiling via a mounting base. In particular, they are often suspended on a metal supporting structure in the ceiling. The metal supporting structure can be a T-shaped beam or another type of metal supporting structure. There are many different types of metal supporting structures, however, and a single conventional mounting base cannot be attached to multiple types of metal supporting structures simultaneously, making it difficult to mount the electronic device (for example, a wireless router) to the ceiling.

Additionally, when the electronic device is desired to be removed from the mounting base, the mounting base and the electronic device are commonly both detached from the metal supporting structure. To avoid dismantling together with the mounting base, additional fasteners are required to fix the mounting base, which makes the installation steps too cumbersome. Additionally, the conventional mounting base cannot be affixed to the wall or other supporting structures.

BRIEF SUMMARY OF THE INVENTION

Embodiments of the invention are provided to address the aforementioned difficulty.

In one embodiment, a mounting base is provided. The mounting base is adapted to be selectively affixed to different supporting structures. The mounting base includes a mounting base body, a first hook, a second hook and a rotatable member. The first hook is formed on the mounting base body. The second hook is formed on the mounting base body. The rotatable member is pivoted on the mounting base body. The rotatable member is adapted to be rotated between a first orientation and the second orientation relative to the mounting base body. When the rotatable member is in the first orientation, the rotatable member is restricted by the mounting base body, a first holding distance is formed between the rotatable member and the first hook, and the first holding distance is also formed between the rotatable member and the second hook. When the rotatable member is in the second orientation, the rotatable member is restricted by the mounting base body, a second holding distance is formed between the rotatable member and the first hook, and the second holding distance is also formed between the rotatable member and the second hook. The first holding distance differs from the second holding distance.

In one embodiment, an electronic apparatus is provided. The electronic apparatus is adapted to be affixed to different supporting structures. The electronic apparatus includes an electronic device and a mounting base. The mounting base is connected to the electronic device. The mounting base includes a mounting base body, a first hook, a second hook and a rotatable member. The first hook is formed on the mounting base body. The second hook is formed on the mounting base body. The rotatable member is pivoted on the mounting base body. The rotatable member is adapted to be rotated between a first orientation and the second orientation relative to the mounting base body. When the rotatable member is in the first orientation, the rotatable member is restricted by the mounting base body, a first holding distance is formed between the rotatable member and the first hook, and the first holding distance is also formed between the rotatable member and the second hook. When the rotatable member is in the second orientation, the rotatable member is restricted by the mounting base body, a second holding distance is formed between the rotatable member and the first hook, and the second holding distance is also formed between the rotatable member and the second hook. The first holding distance differs from the second holding distance.

The mounting base of the embodiment of the invention can be connected to the ceiling structures of different sizes of shapes (such as T-bar or other ceiling structures). When the user detaches the mounting base, the user can rotate the rotatable member to detach the mounting base from the supporting structure, and the supporting structure (for example, ceiling structure) is prevented from being damaged. Additionally, the mounting base of the embodiment of the invention can be affixed to other supporting structure such as the wall or the pillar.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
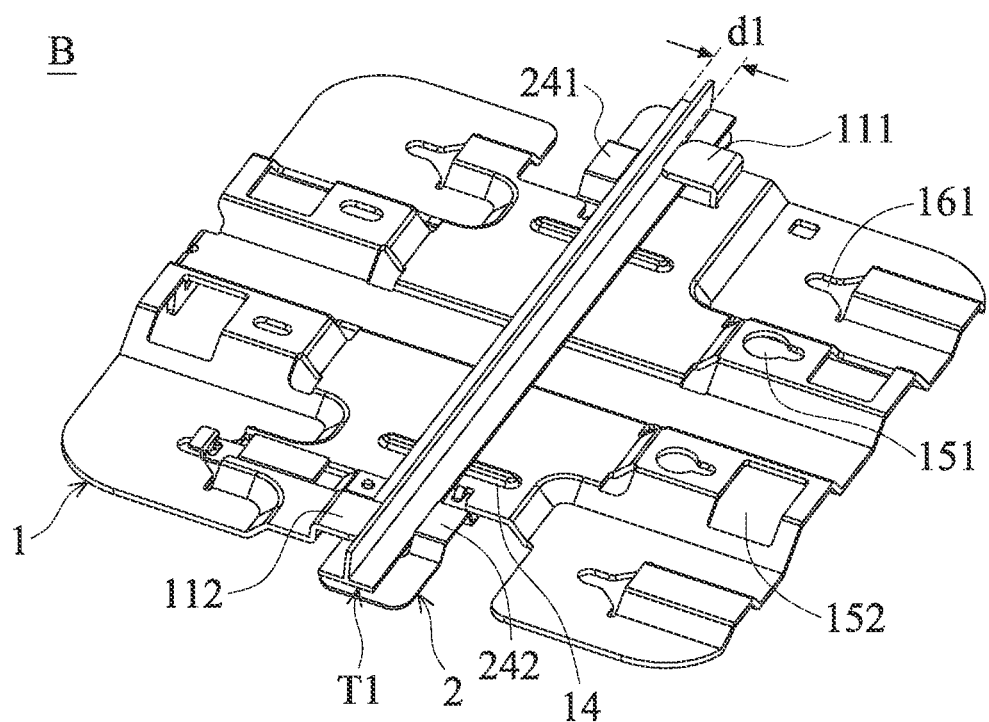
FIGS. 1A and 1B shows a mounting base of the embodiment of the invention connected to a first ceiling structure.
Figure 1B:
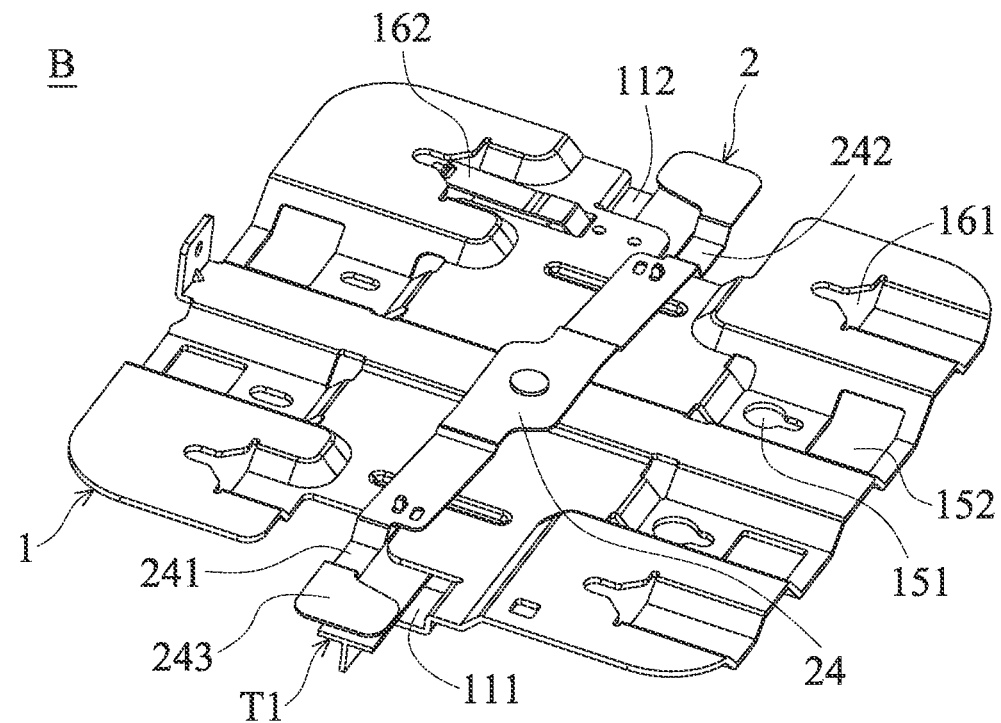

FIGS. 1A and 1B shows a mounting base of the embodiment of the invention connected to a first ceiling structure.

Figure 2A:
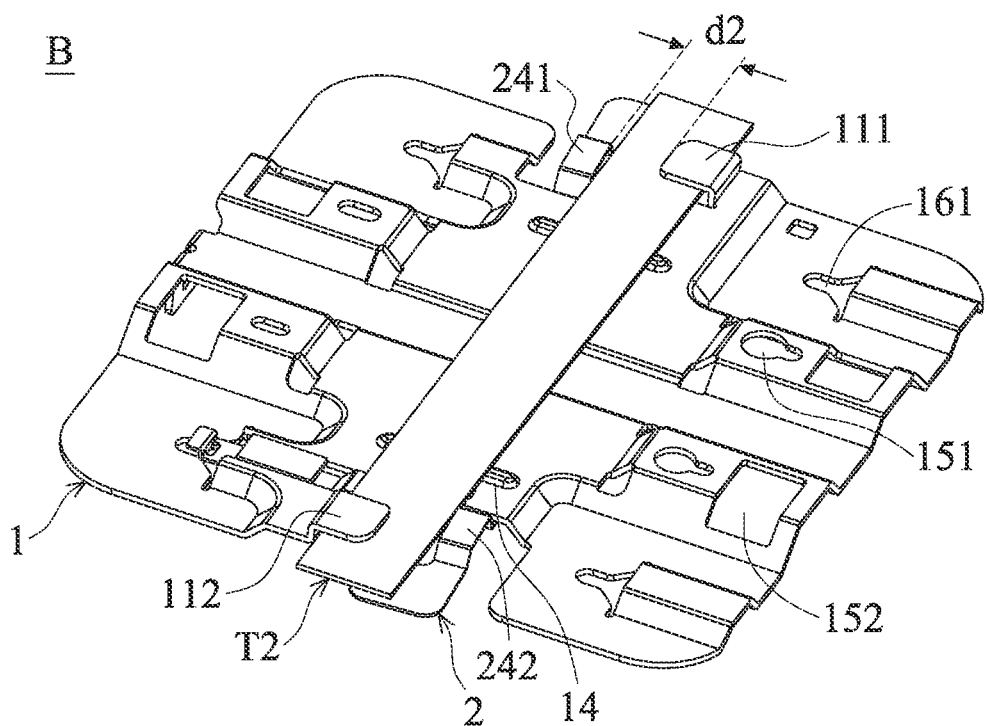
FIGS. 2A and 2B shows the mounting base of the embodiment of the invention connected to a second ceiling structure.
Figure 2B:
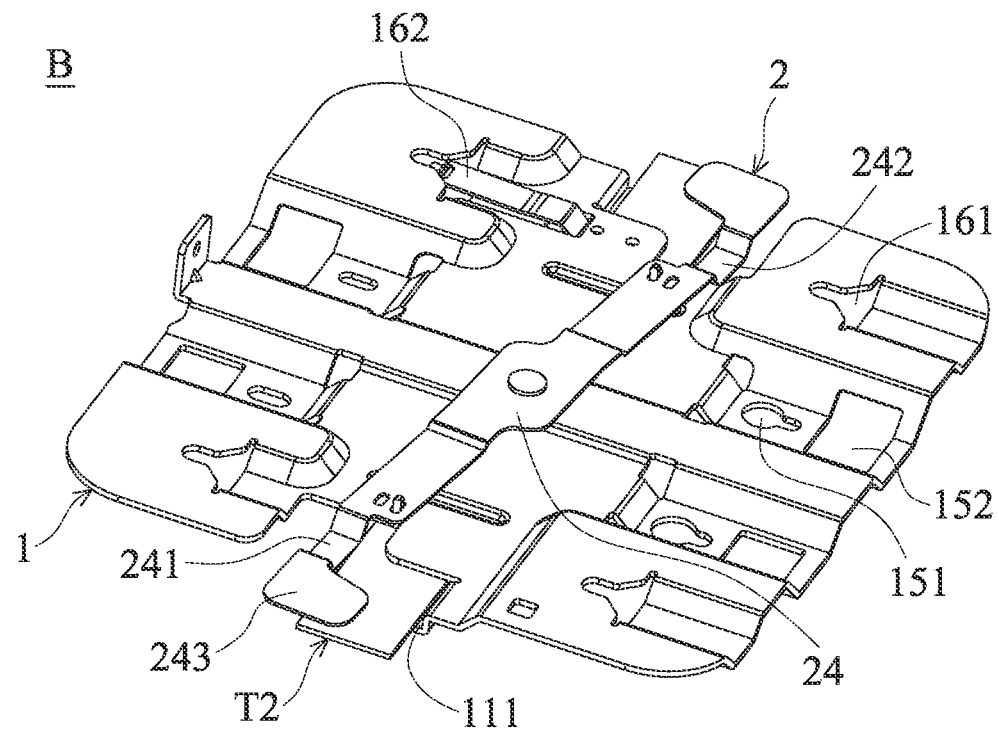

FIGS. 2A and 2B shows the mounting base of the embodiment of the invention connected to a second ceiling structure. With reference to FIGS. 1A, 1B, 2A and 2B, the mounting base B of the embodiment of the invention is adapted to be selectively affixed to different supporting structures. The mounting base B includes a mounting base body 1, a first hook 111, a second hook 112 and a rotatable member 2. The first hook 111 is formed on the mounting base body 1. The second hook 112 is formed on the mounting base body 1. The rotatable member 2 is pivoted on the mounting base body 1. The rotatable member 2 is adapted to be rotated between a first orientation (FIGS. 1A and 1B) and the second orientation (FIGS. 2A and 2B) relative to the mounting base body 1. When the rotatable member 2 is in the first orientation (FIGS. 1A and 1B), the rotatable member 2 is restricted by the mounting base body 1. A first holding distance d1 is formed between the rotatable member 2 and the first hook 111, and the first holding distance d1 is also formed between the rotatable member 2 and the second hook 112. When the rotatable member 2 is in the second orientation (FIGS. 2A and 2B), the rotatable member 2 is restricted by the mounting base body 1, a second holding distance d2 is formed between the rotatable member 2 and the first hook 111, and the second holding distance d2 is also formed between the rotatable member 2 and the second hook 112. The first holding distance d1 differs from the second holding distance d2.

With reference to FIGS. 1A, 1B, 2A and 2B, in one embodiment, the supporting structures comprise a first ceiling structure T1 (FIGS. 1A and 1B) and a second ceiling structure T2 (FIGS. 2A and 2B). In one embodiment, the first ceiling structure T1 and the second ceiling structure T2 can be T-bar or planar ceiling structure. The size of the first ceiling structure T1 differs from the size of the second ceiling structure T2. In the first connection state (FIGS. 1A and 1B), the rotatable member 2 is in the first orientation. The first hook 111 abuts one side of the first ceiling structure T1. The second hook 112 abuts another side of the first ceiling structure T1. The first ceiling structure T1 is partially held between the rotatable member 2 and the first hook 111. The first ceiling structure T1 is partially held between the rotatable member 2 and the second hook 112. In a second connection state, the rotatable member 2 is in the second orientation, the first hook 111 abuts one side of the second ceiling structure T2. The second hook 112 abuts another side of the second ceiling structure T2. The second ceiling structure T2 is partially held between the rotatable member 2 and the first hook 111. The second ceiling structure T2 is partially held between the rotatable member 2 and the second hook 112.

Figure 3A:
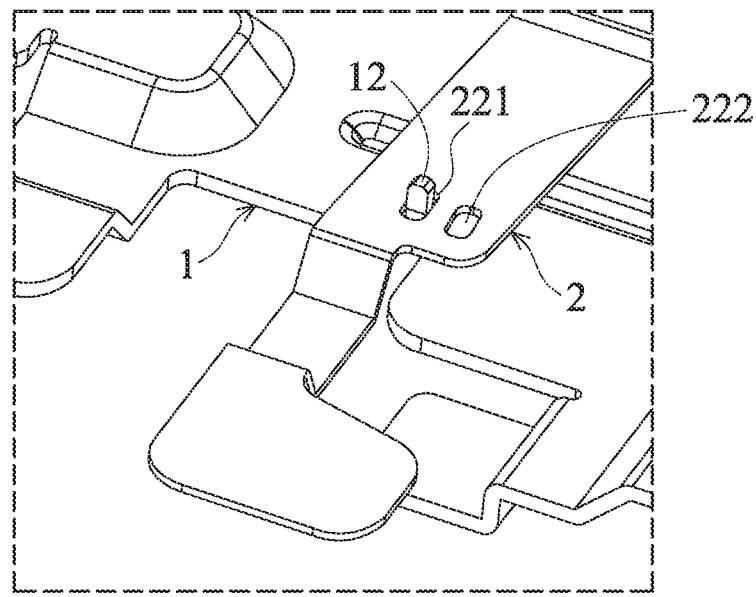
FIGS. 3A, 3B and 3C show a positioning means of the rotatable member of an embodiment of the invention.
Figure 3B:
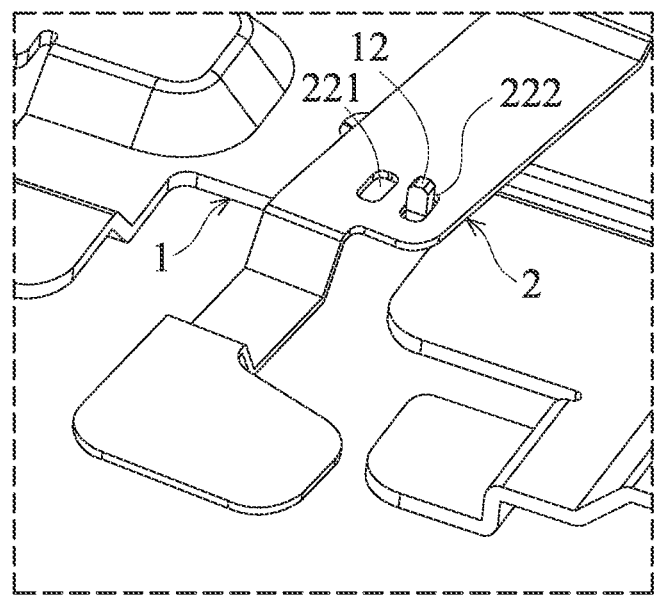
Figure 3C:
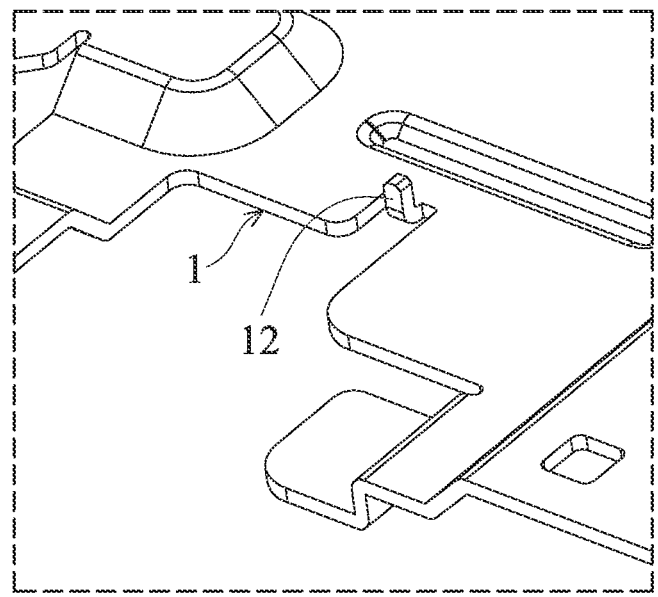

FIGS. 3A, 3B and 3C show a positioning means of the rotatable member of an embodiment of the invention. With reference to FIGS. 3A, 3B and 3C, in one embodiment, the mounting base body 1 comprises a body positioning hook 12. The rotatable member 2 comprises a first member positioning hole 221 and a second member positioning hole 222. When the rotatable member 2 is in the first orientation (FIG. 3A), the body positioning hook 12 connects the first member positioning hole 221 to position the rotatable member 2. When the rotatable member 2 is in the second orientation (FIG. 3B), the body positioning hook 12 connects the second member positioning hole 222 to position the rotatable member 2. Therefore, the mounting base can be firmly connected to ceiling structures of different sizes.

Figure 4A:
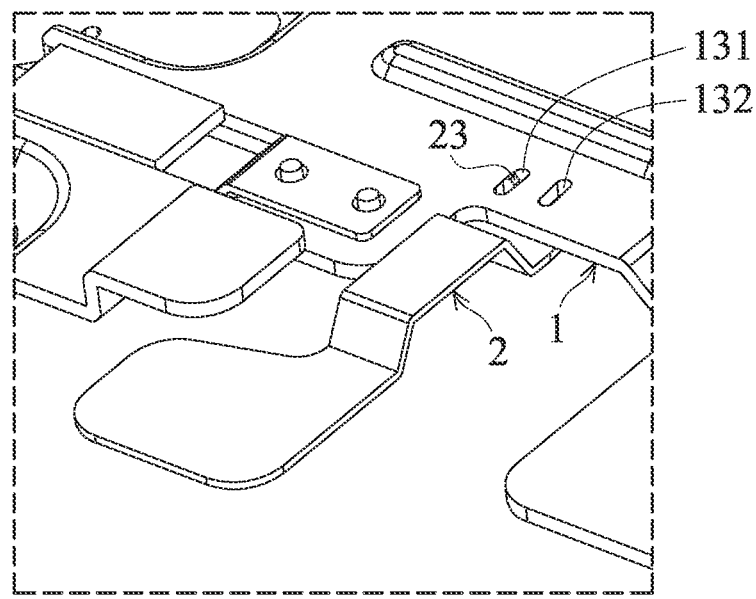
FIGS. 4A, 4B and 4C show a positioning means of the rotatable member of another embodiment of the invention.
Figure 4B:
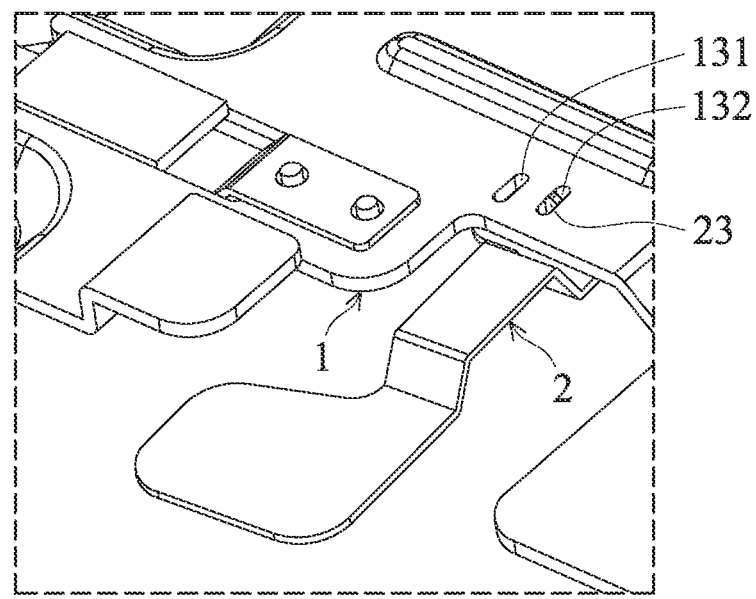
Figure 4C:
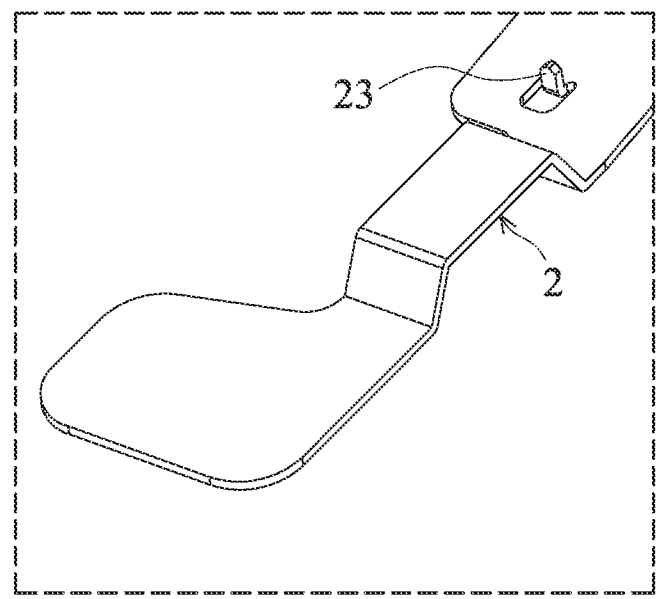

FIGS. 4A, 4B and 4C show a positioning means of the rotatable member of another embodiment of the invention. With reference to FIGS. 4A, 4B and 4C, in one embodiment, the mounting base body 1 comprises a first body positioning hole 131 and a second body positioning hole 132. The rotatable member 2 comprises a member positioning hook 23. When the rotatable member 2 is in the first orientation (FIG. 4A), the member positioning hook 23 connects the first body positioning hole 131 to position the rotatable member 2. When the rotatable member 2 is in the second orientation (FIG. 4B), the member positioning hook 23 connects the second body positioning hole 132 to position the rotatable member 2. Therefore, the mounting base can be firmly connected to ceiling structures of different sizes.

With reference to FIGS. 1A and 2A, in one embodiment, the mounting base body 1 comprises at least one protrusion 14. In the first connection state (FIG. 1A), the protrusion 14 pushes the bottom of the first ceiling structure T1, and the first ceiling structure T1 thus sufficiently abuts the first hook 111 and the second hook 112. In a second connection state (FIG. 2A), the protrusion 14 pushes the bottom of the second ceiling structure T2, and the second ceiling structure T2 thus sufficiently abuts the first hook 111 and the second hook 112.

With reference to FIGS. 1A, 1B, 2A and 2B, in one embodiment, the rotatable member 2 comprises a rotatable member body 24, a first member abutting portion 241 and a second member abutting portion 242. The rotatable member body 24 pivots on the mounting base body 1. The first member abutting portion 241 and the second member abutting portion 242 are formed on the two ends of the rotatable member body 24. In the first connection state (FIGS. 1A and 1B), the first member abutting portion 241 and the second member abutting portion 242 abut the two sides of the first ceiling structure T1. In the second connection state (FIGS. 2A and 2B), the first member abutting portion 241 and the second member abutting portion 242 abut the two sides of the second ceiling structure T2.

With reference to FIGS. 1B and 2B, in one embodiment, the rotatable member further comprises at least one rotatable member grip 243, and the first member abutting portion 241 is located between the rotatable member grip 243 and the rotatable member body 24. The user can hold and push the rotatable member grip 243 to rotate the rotatable member 2.

Figure 5:
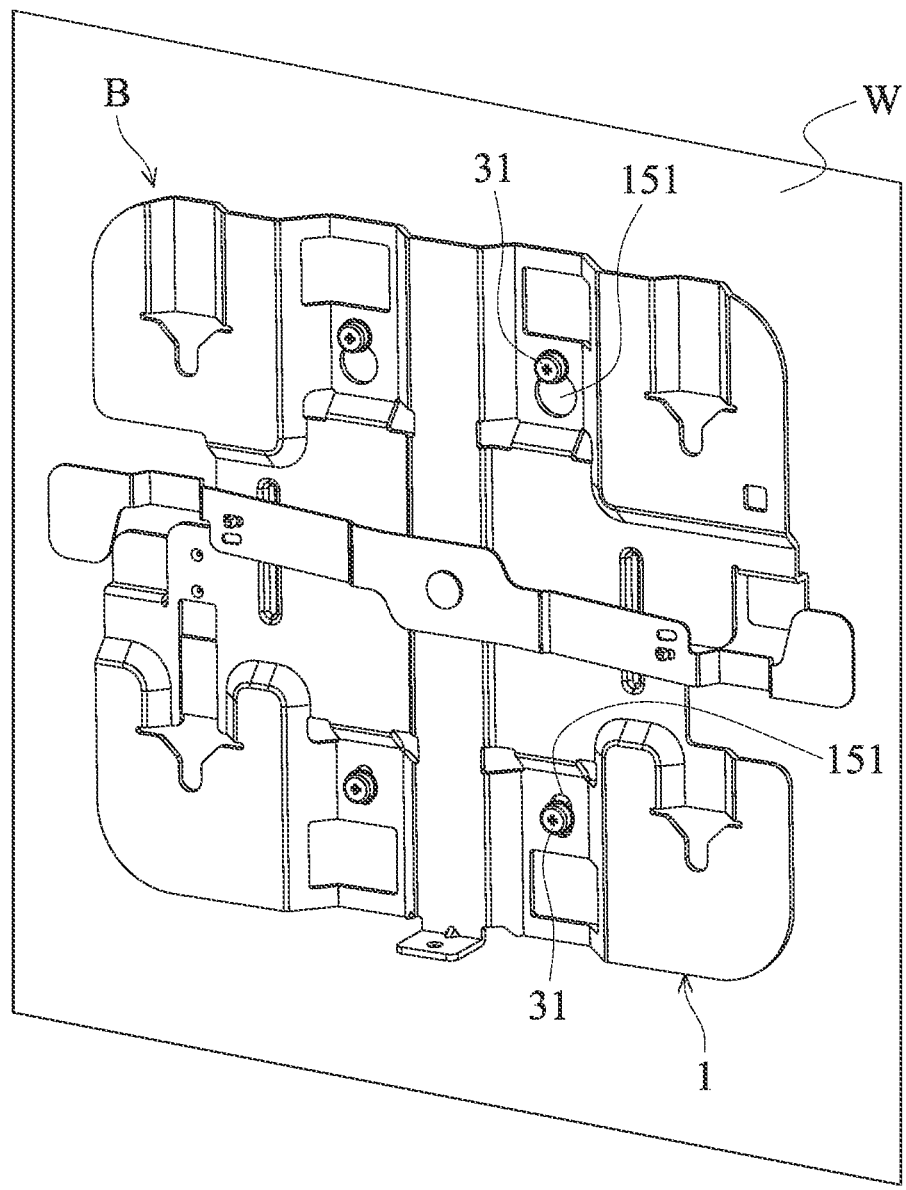
FIG. 5 shows the mounting base of the embodiment of the invention being affixed to a wall.

FIG. 5 shows the mounting base of the embodiment of the invention being affixed to a wall. With reference to FIGS. 1A and 5, in one embodiment, the mounting base B further comprises a plurality of fasteners 31. The supporting structures comprise a wall W. The mounting base body 1 comprises a plurality of first body openings 151. The fasteners 31 pass through the first body openings 151 to affix the mounting base B to the wall W. In one embodiment, the fasteners can be bolts, nails or other fasteners.

Figure 6:
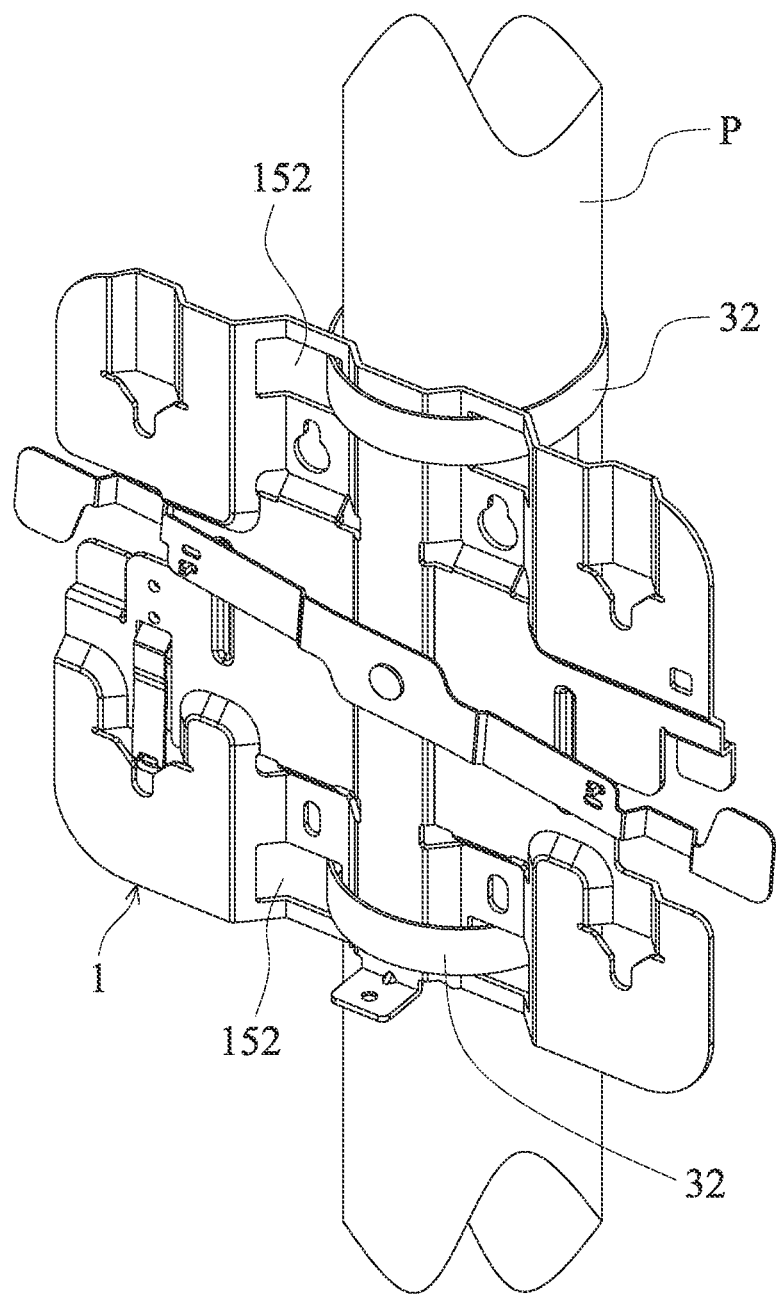
FIG. 6 shows the mounting base of the embodiment of the invention being affixed to a pillar.

FIG. 6 shows the mounting base of the embodiment of the invention being affixed to a pillar. With reference to FIGS. 1A and 6, in one embodiment, the mounting base B further comprises a plurality of tie straps 32. The supporting structures comprise a pillar P. The mounting base body 1 comprises a plurality of second body openings 152. The tie straps 32 pass through the second body openings 152 to fasten the mounting base B to the pillar P.

Figure 7A:
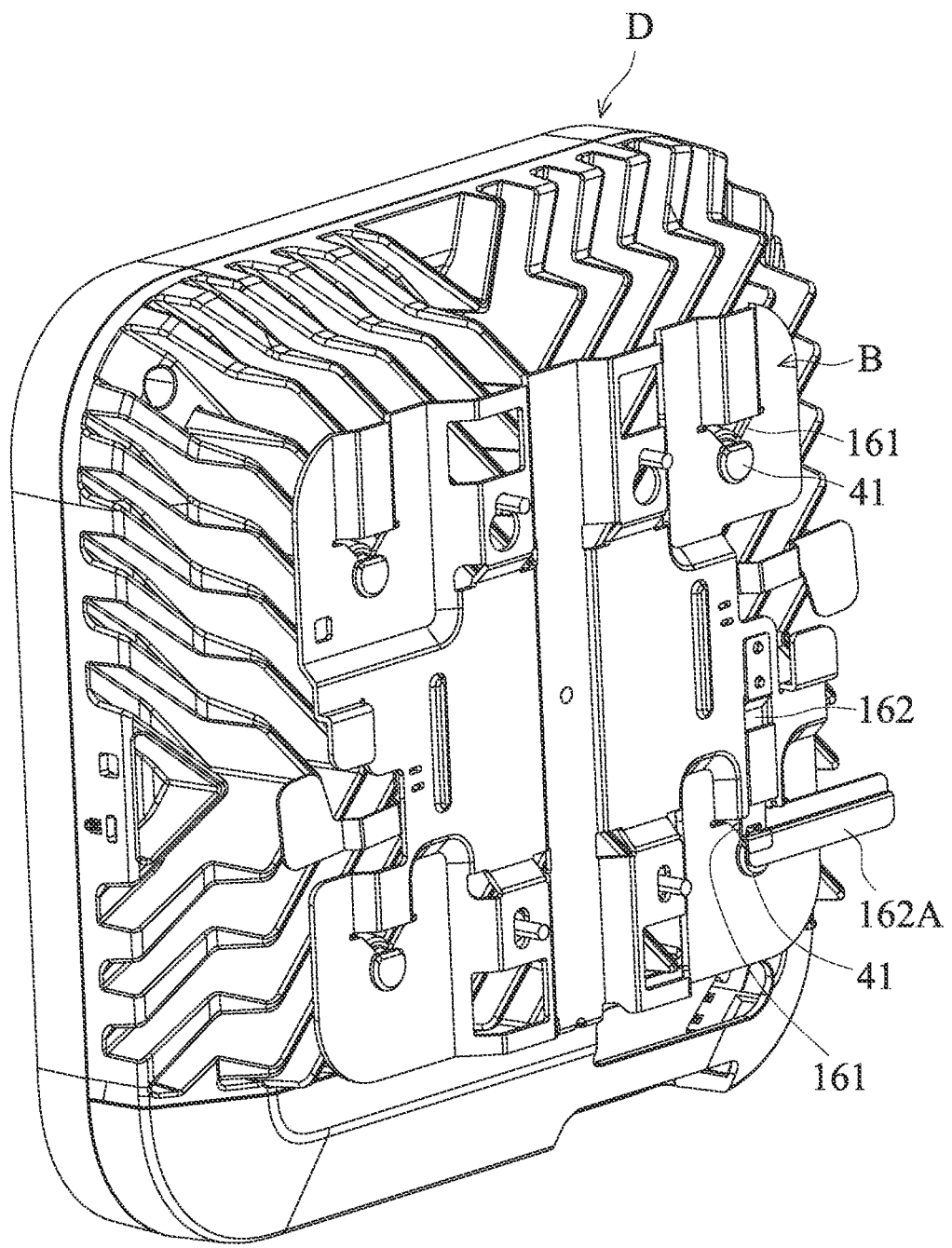
FIGS. 7A and 7B show an electronic apparatus of the embodiment of the invention.
Figure 7B:
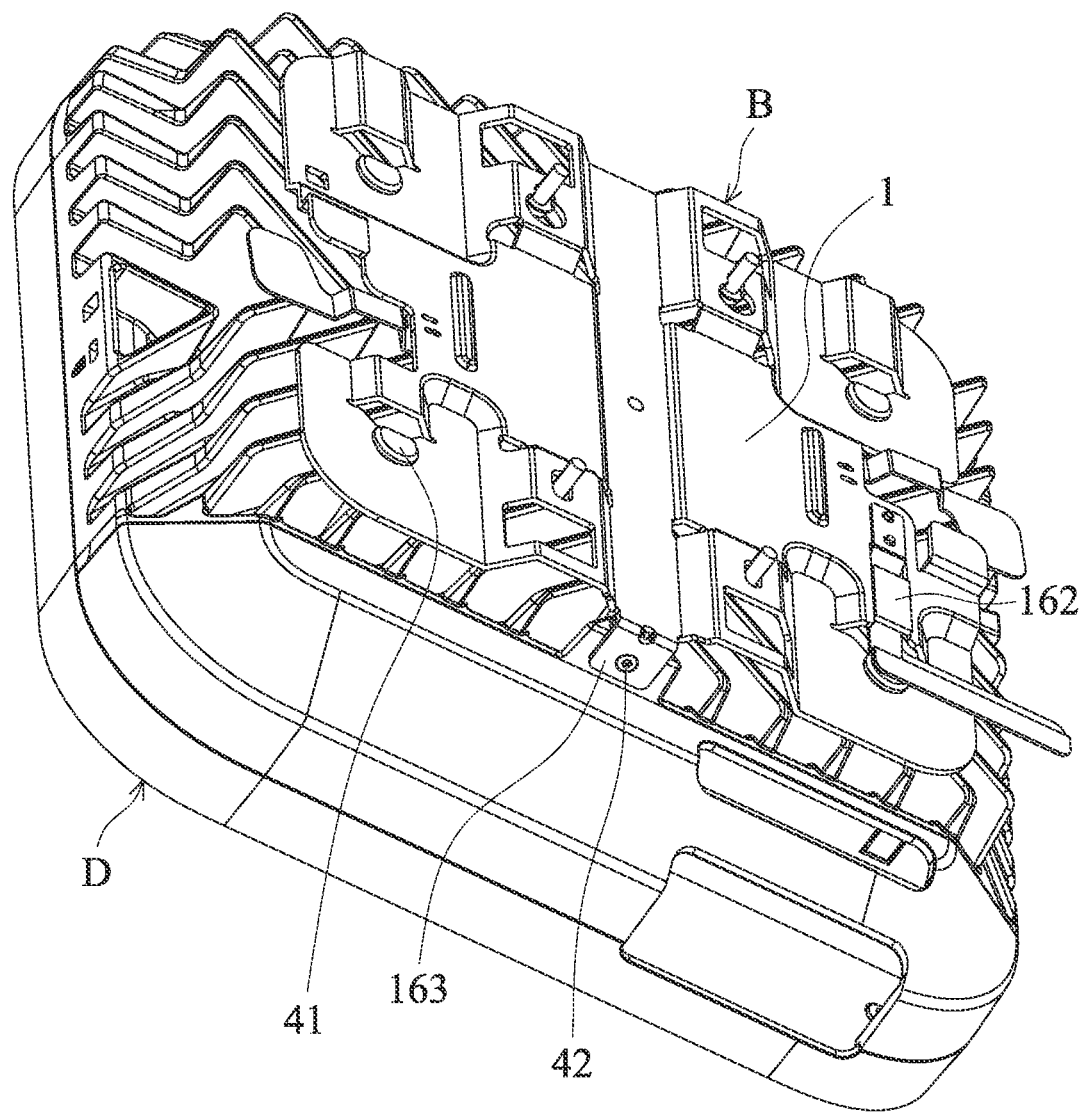

FIGS. 7A and 7B show an electronic apparatus of the embodiment of the invention. With reference to FIGS. 1A, 7A and 7B, in another embodiment, an electronic apparatus is provided. The electronic apparatus includes an electronic device D and a mounting base B. In one embodiment, the electronic device D comprises a plurality of wedging posts 41. The mounting base body 1 comprises a plurality of wedging recesses 161. When the electronic device D is connected to the mounting base B, the wedging posts 41 are wedged to the wedging recesses 161.

With reference to FIGS. 1B, 7A and 7B, in one embodiment, the mounting base B comprises an elastic sheet 162. The elastic sheet 162 is disposed on the mounting base body 1. The elastic sheet 162 corresponds to one of the wedging recess 161. When the electronic device D is connected to the mounting base B, the elastic sheet 162 is adapted to abut one of the wedging posts 41 to restrict the electronic device D, and the electronic device D is prevented from being separated from the mounting base B.

With reference to FIG. 7A, in one embodiment, the elastic sheet 162 comprises a sheet grip 162A, and the sheet grip 162A protrudes from an edge of the mounting base body 1. The user can push the sheet grip 162A to remove the electronic device D from the mounting base B.

With reference to FIG. 7B, in one embodiment, the mounting base body 1 further comprises a body fastened portion 163. The electronic device D is affixed to the body fastened portion 163 by a bolt 42. The extending direction of the bolt 42 is perpendicular to the extending direction of the wedging posts 41.

The mounting base of the embodiment of the invention can be connected to the ceiling structures of different sizes of shapes (such as T-bar or other ceiling structures). When the user detaches the mounting base, the user can rotate the rotatable member to detach the mounting base from the supporting structure, and the supporting structure (for example, ceiling structure) is prevented from being damaged. Additionally, the mounting base of the embodiment of the invention can be affixed to other supporting structure such as the wall or the pillar.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mounting base, adapted to be selectively affixed to different supporting structures, comprising:
    a mounting base body;
    a first hook, formed on the mounting base body;
    a second hook, formed on the mounting base body; and
    a rotatable member, pivoted on the mounting base body, wherein the rotatable member is adapted to be rotated between a first orientation and a second orientation relative to the mounting base body, and when the rotatable member is in the first orientation, the rotatable member is restricted by the mounting base body, a first holding distance is formed between the rotatable member and the first hook, and the first holding distance is also formed between the rotatable member and the second hook, and when the rotatable member is in the second orientation, the rotatable member is restricted by the mounting base body, a second holding distance is formed between the rotatable member and the first hook, and the second holding distance is also formed between the rotatable member and the second hook, wherein the first holding distance differs from the second holding distance.

2. The mounting base as claimed in claim 1, wherein the supporting structures comprise a first ceiling structure and a second ceiling structure, a size of the first ceiling structure differs from a size of the second ceiling structure, wherein in a first connection state, the rotatable member is in the first orientation, the first hook abuts one side of the first ceiling structure, the second hook abuts another side of the first ceiling structure, the first ceiling structure is partially held between the rotatable member and the first hook, the first ceiling structure is partially held between the rotatable member and the second hook, wherein in a second connection state, the rotatable member is in the second orientation, the first hook abuts one side of the second ceiling structure, the second hook abuts another side of the second ceiling structure, the second ceiling structure is partially held between the rotatable member and the first hook, the second ceiling structure is partially held between the rotatable member and the second hook.

3. The mounting base as claimed in claim 2, wherein the mounting base body comprises a body positioning hook, the rotatable member comprises a first member positioning hole and a second member positioning hole, and when the rotatable member is in the first orientation, the body positioning hook connects the first member positioning hole to position the rotatable member, and when the rotatable member is in the second orientation, the body positioning hook connects the second member positioning hole to position the rotatable member.

4. The mounting base as claimed in claim 2, wherein the mounting base body comprises a first body positioning hole and a second body positioning hole, the rotatable member comprises a member positioning hook, and when the rotatable member is in the first orientation, the member positioning hook connects the first body positioning hole to position the rotatable member, and when the rotatable member is in the second orientation, the member positioning hook connects the second body positioning hole to position the rotatable member.

5. The mounting base as claimed in claim 2, wherein the mounting base body comprises at least one protrusion, wherein in the first connection state, the protrusion pushes a bottom of the first ceiling structure, and the first ceiling structure thus sufficiently abuts the first hook and the second hook, wherein in a second connection state, the protrusion pushes a bottom of the second ceiling structure, and the second ceiling structure thus sufficiently abuts the first hook and the second hook.

6. The mounting base as claimed in claim 2, wherein the rotatable member comprises a rotatable member body, a first member abutting portion and a second member abutting portion, the rotatable member body pivots on the mounting base body, the first member abutting portion and the second member abutting portion are formed on the ends of the rotatable member body, wherein in the first connection state, the first member abutting portion and the second member abutting portion abut two sides of the first ceiling structure, and in the second connection state, the first member abutting portion and the second member abutting portion abut two sides of the second ceiling structure.

7. The mounting base as claimed in claim 6, wherein the rotatable member further comprises at least one rotatable member grip, and the first member abutting portion is located between the rotatable member grip and the rotatable member body.

8. The mounting base as claimed in claim 1, further comprising a plurality of fasteners, wherein the supporting structures comprise a wall, the mounting base body comprises a plurality of first body openings, and the fasteners pass through the first body openings to affix the mounting base to the wall.

9. The mounting base as claimed in claim 1, further comprising a plurality of tie straps, the supporting structures comprise a pillar, the mounting base body comprises a plurality of second body openings, and the tie straps pass through the second body openings to fasten the mounting base to the pillar.

10. An electronic apparatus, adapted to be affixed to different supporting structures, comprising:
an electronic device; and
a mounting base, connected to the electronic device, comprising:
a mounting base body;
a first hook, formed on the mounting base body;
a second hook, formed on the mounting base body; and
a rotatable member, pivoted on the mounting base body, wherein the rotatable member is adapted to be rotated between a first orientation and a second orientation relative to the mounting base body, and when the rotatable member is in the first orientation, the rotatable member is restricted by the mounting base body, a first holding distance is formed between the rotatable member and the first hook, and the first holding distance is also formed between the rotatable member and the second hook, and when the rotatable member is in the second orientation, the rotatable member is restricted by the mounting base body, a second holding distance is formed between the rotatable member and the first hook, and the second holding distance is also formed between the rotatable member and the second hook, wherein the first holding distance differs from the second holding distance.

11. The electronic apparatus as claimed in claim 10, wherein the electronic device comprises a plurality of wedging posts, the mounting base body comprises a plurality of wedging recesses, and when the electronic device is connected to the mounting base, the wedging posts are wedged to the wedging recesses.

12. The electronic apparatus as claimed in claim 11, wherein the mounting base comprises an elastic sheet, the elastic sheet is disposed on the mounting base body, the elastic sheet corresponds to one of the wedging recess, and when the electronic device is connected to the mounting base, the elastic sheet is adapted to abut one of the wedging posts to restrict the electronic device.

13. The electronic apparatus as claimed in claim 12, wherein the elastic sheet comprises a sheet grip, and the sheet grip protrudes from an edge of the mounting base body.

14. The electronic apparatus as claimed in claim 11, wherein the mounting base body further comprises a body fastened portion, the electronic device is affixed to the body fastened portion by a bolt, and an extending direction of the bolt is perpendicular to an extending direction of the wedging posts.

* * * * *